United States Patent
Chang et al.

(10) Patent No.: US 11,513,480 B2
(45) Date of Patent: Nov. 29, 2022

(54) METHOD AND DEVICE FOR AUTOMATICALLY DIAGNOSING AND CONTROLLING APPARATUS IN INTELLIGENT BUILDING

(71) Applicant: Terminus (Beijing) Technology Co., Ltd., Beijing (CN)

(72) Inventors: Xiaomin Chang, Beijing (CN); Yanfei Qie, Beijing (CN); Lei Wang, Beijing (CN); Guichen Wang, Beijing (CN); Lu Peng, Beijing (CN); Baisong Wang, Beijing (CN)

(73) Assignee: Terminus (Beijing) Technology Co., Ltd., Beijing (CN)

(*) Notice: Subject to any disclaimer, the term of this patent is extended or adjusted under 35 U.S.C. 154(b) by 1283 days.

(21) Appl. No.: 15/937,171

(22) Filed: Mar. 27, 2018

(65) Prior Publication Data
US 2019/0302713 A1 Oct. 3, 2019

(51) Int. Cl.
| | |
|---|---|
| *G06F 11/22* | (2006.01) |
| *G05B 13/04* | (2006.01) |
| *G05B 13/02* | (2006.01) |
| *G06F 30/27* | (2020.01) |
| *G06F 30/20* | (2020.01) |
| *G06N 3/02* | (2006.01) |
| *G06F 16/28* | (2019.01) |
| *H04L 41/16* | (2022.01) |

(Continued)

(52) U.S. Cl.
CPC ......... *G05B 13/048* (2013.01); *G05B 13/027* (2013.01); *G05B 23/0254* (2013.01); *G06F 11/2263* (2013.01); *G06F 16/285* (2019.01); *G06F 16/906* (2019.01); *G06F 30/20* (2020.01); *G06F 30/27* (2020.01); *G06N 3/02* (2013.01); *H04L 41/16* (2013.01)

(58) Field of Classification Search
CPC ............... G05B 13/048; G05B 13/027; G05B 23/0254; G06F 11/2263; G06F 16/285; G06F 16/906; G06F 30/20; G06F 30/27; G06N 3/02; H04L 41/16
See application file for complete search history.

(56) References Cited

FOREIGN PATENT DOCUMENTS

CN 108089440 A * 5/2018 ........... G05B 13/042

\* cited by examiner

*Primary Examiner* — Shirley X Zhang
(74) *Attorney, Agent, or Firm* — Kelly & Kelley, LLP

(57) ABSTRACT

Disclosed are a method for automatically diagnosing and controlling an apparatus in an intelligent building and relevant device. The method includes: performing, based on historical data of working parameters of multiple apparatuses, an abnormal diagnosis on received real-time data of the working parameters; determining an abnormal apparatus; selecting a neural network predictive control model corresponding to the abnormal apparatus; selecting one piece of non-abnormal data which has a same parameter type as that of the abnormal data and is close to the current abnormal data in time as a predictive control target, and determining a predictive control data that can cause an output matching the predictive control target; and controlling the abnormal apparatus according to the predictive control data. The automatic diagnosis and automatic control of an apparatus in an intelligent building are realized, meanwhile the safe and efficient operation of all apparatuses in an intelligent building is ensured.

8 Claims, 9 Drawing Sheets

(51) Int. Cl.
*G05B 23/02* (2006.01)
*G06F 16/906* (2019.01)

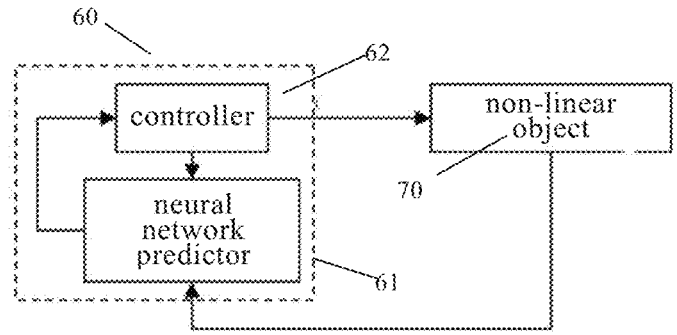

Fig. 9

| selecting an apparatus operation model group corresponding to the abnormal apparatus from a preset operation model library, wherein apparatus operation model groups of the plurality of apparatuses in the intelligent building are stored in the preset operation model library, and a plurality of operation models of a corresponding apparatus is stored in the apparatus operation model group | S311 |

| obtaining a corresponding operation model from the selected apparatus operation model group according to a parameter type of the abnormal data | S312 |

Fig. 10

```
┌─────────────────────────────────────────────────────────┐
│ selecting, from the historical data of the abnormal     │
│ apparatus, one piece of non-abnormal data which has a   │
│ same parameter type as that of the abnormal data and is │──S41
│ close to the current abnormal data in time as a         │
│ predictive control target, and determining, based on the│
│ neural network predictive control model, several sets of│
│ data that belongs to the other parameter types and that │
│ can cause a output matching the predictive control target│
└─────────────────────────────────────────────────────────┘
                            │
                            ▼
┌─────────────────────────────────────────────────────────┐
│            obtaining an abnormal parameter              │──S42
│ set of the other parameter types causing the abnormal data│
└─────────────────────────────────────────────────────────┘
                            │
                            ▼
┌─────────────────────────────────────────────────────────┐
│ determining one set of data from the several sets of    │
│ data, which is closest in distance to the abnormal      │──S43
│ parameter set as the predictive control data            │
└─────────────────────────────────────────────────────────┘
```

Fig. 11

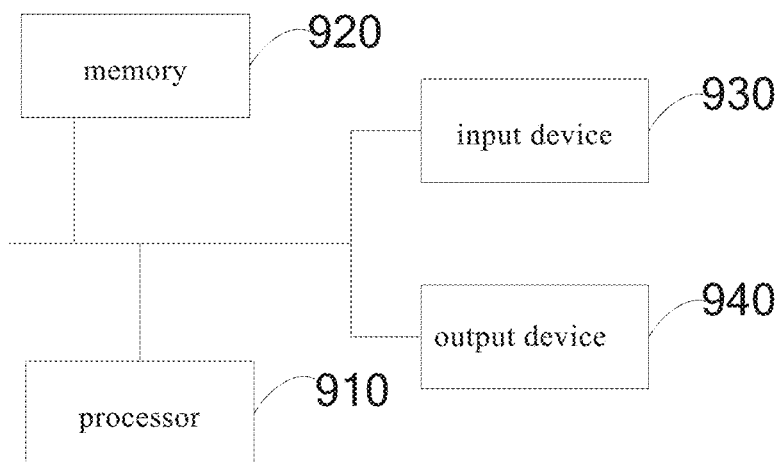

Fig. 12

METHOD AND DEVICE FOR AUTOMATICALLY DIAGNOSING AND CONTROLLING APPARATUS IN INTELLIGENT BUILDING

TECHNICAL FIELD

The disclosure relates to the field of control technology in an intelligent building, and in particular to a method for automatically diagnosing and controlling an apparatus in an intelligent building.

BACKGROUND

An intelligent building, which is evolved from traditional building management, is intended to implement building management in respect of building automation, security automation, fire automation and energy consumption management automation. Along with continuous promotion of urbanization and increasing number of large buildings, an intelligent building is increasingly becoming an important means of building management. In the prior art, the following solution platforms or systems are present to meet different requirements of users:
1. IBMS (Integrated Building Management System) building intelligent integration platform
   User requirement: unified management of weak electricity intelligent engineering
   Typical cases: Wanda HUIYUN®, Shanghai Center IBMS
2. Building energy management platform
   User requirements: high and low voltage power distribution monitoring, tenant metering and charging system, unified management of building energy, energy audit and energy-saving renovation
   Typical cases: government energy monitoring and metering platform, SOHO China energy management platform, Huarun Group energy management platform
3. Refrigeration stations group control system
   User requirements: intelligent operation of refrigeration stations, energy-saving operation of refrigeration stations
   Typical cases: Siemens Shanghai Center, Beijing Yintai Center, Shenzhen International Trade Building
   However, the inventor found that all the modes adopted in the above solutions are: the traditional DDC controller+ alarm module+manual formulation strategy, that is, the multiple sensors should be arranged in advance and are required to detect the problem and notify the staff by the alarm, and then the staff can use personal practical experience to formulate the corresponding control strategy, so that optimization control is completed manually at the central control platform. In other words, the above solutions fail to realize automatic diagnosis and failure analysis of an apparatus in a simple and unified way, and fail to automatically optimize and control the apparatus through machine.

SUMMARY

An embodiment of the disclosure provides a method for automatically diagnosing and controlling an apparatus in an intelligent building so as to solve at least one of the above technical problems.

In a first aspect, an embodiment of the disclosure provides a method for automatically diagnosing and controlling an apparatus in an intelligent building, including the steps of:
performing, based on historical data of working parameters of multiple apparatuses in an intelligent building, an abnormal diagnosis on received real-time data of the working parameters of the multiple apparatuses, and generating a diagnostic result;
determining, when the diagnosis result indicates that abnormal data is present, an abnormal apparatus corresponding to the abnormal data;
selecting a neural network predictive control model corresponding to the abnormal apparatus, wherein the neural network predictive control model is obtained through a training with the historical data of the abnormal apparatus, wherein the training is carried out by taking historical data of the parameter type of the abnormal data as an output and taking historical data of other parameter types as an input;
selecting, from the historical data of the abnormal apparatus, one piece of non-abnormal data which has a same parameter type as that of the abnormal data and is close to the current abnormal data in time as a predictive control target, and determining, based on the neural network predictive control model, a predictive control data that belongs to the other parameter types and that can cause an output matching the predictive control target; and
controlling the abnormal apparatus according to the predictive control data.

In a second aspect, an embodiment of the disclosure provides a non-transitory computer-readable storage medium storing executable instructions, when executed by an electronic device, causes the electronic device (including but not limited to a computer, a server, or a network apparatus, etc.) to implement the method for automatically diagnosing and controlling an apparatus in an intelligent building according to the disclosure.

In a third aspect, an embodiment of the disclosure provides an electronic device, including at least one processor; and a memory communicably connected with the at least one processor and for storing instructions executable by the at least one processor, wherein the execution of the instructions causes the at least one processor to implement the method for automatically diagnosing and controlling an apparatus in an intelligent building according to the disclosure.

In a fourth aspect, an embodiment of the present invention further provides a computer program product, comprising program instructions which, when executed by a computer, cause the computer to carry out the method for automatically diagnosing and controlling an apparatus in an intelligent building according to the present invention.

In the embodiments of the disclosure, by diagnosing, based on historical data of an apparatus in an intelligent building, the real-time working data of the apparatuses and further determining the abnormal apparatus, the automatic diagnosis of the abnormal apparatus is realized; then a pre-trained neural network predictive control model is further selected and a particular non-abnormal data of the abnormal apparatus is taken as the target control data to determine the other types of parameter data of the abnormal apparatus matched therewith, and the determined other types of parameter data are used to control the abnormal apparatus so as to realize optimization control of the abnormal apparatus.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 9 is a schematic structural diagram of a neural network predictive control model in the disclosure.

FIG. 10 is a block diagram illustrating an embodiment of step S31.

FIG. 11 is a block diagram illustrating an embodiment of step S40.

FIG. 12 is a schematic structural diagram of an embodiment of an electronic device according to the disclosure.

DETAILED DESCRIPTION

To make the objectives, technical solutions, and advantages of the embodiments of the disclosure clearer, the technical solutions in the embodiments of the disclosure will be described in detail below with reference to the accompanying drawings. Obviously, the described embodiments are merely illustrative in nature and are in no way intended to limit the disclosure, its application, or uses. The broad teachings of the disclosure can be implemented in a variety of forms. Therefore, although this disclosure includes specific examples, the true scope of the disclosure should not be so limited since other modifications will become apparent upon a study of the drawings, the specification, and the following claims. For example, one or more steps may be executed in different order (or concurrently) without altering the principles of the present disclosure.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

In the disclosure, "module", "device", "system" and the like refer to related entity applied to a computer, such as hardware, a combination of hardware and software, software or software in execution and the like. For example, the element of the disclosure may be, but is not limited to, a process running on a processor, a processor, an object, an executable element, a thread of execution, a program, and/or a computer. Also, the application or script running on the server and the server can be an element. One or more elements may be in a process and/or thread of execution and an element may be localized on one computer and/or distributed between two or more computers and may be executed by a variety of computer-readable media. The elements may also communicate through local and/or remote processes based on signals having one or more data packets.

Finally, it should also be noted that, terms such as first and second are merely used to distinguish one from another without necessarily requiring or implying that there is any such actual relationship or order. Also, the terms "comprising", "including", include not only the recited elements but also other elements not expressly listed or also elements inherent to such process, method, article, or apparatus. Without further limitations, elements defined by the statement "comprise(s) . . . " do not exclude the presence of additional feasible elements in the process, method, article, or apparatus.

Figure 1A:
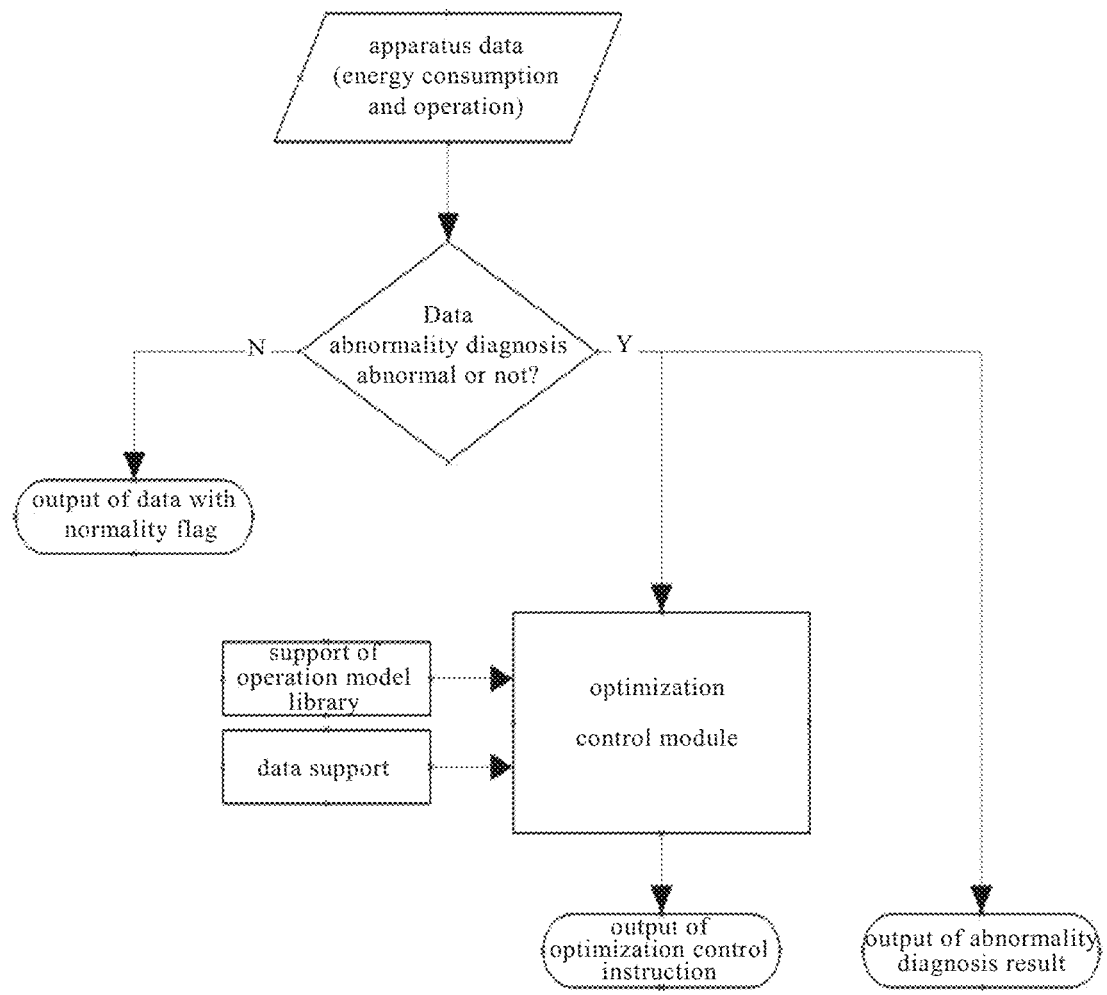
FIG. 1a and FIG. 1b are respectively a flow chart of a method for automatically diagnosing and controlling an apparatus in an intelligent building according to some embodiments.

As shown in FIG. 1a, in some embodiments, the method for automatically diagnosing and controlling an apparatus in an intelligent building includes: determining whether abnormal data exists in the apparatus data (including energy consumption data and operation data); when determining that there is no abnormal data, the system outputs a data with normality flag; when determining that there is abnormal data, the system outputs an abnormality diagnosis result to an optimization control module; the optimization control module formulates an optimization control strategy according to an operation model library, and outputs an optimization control instruction.

Figure 1B:
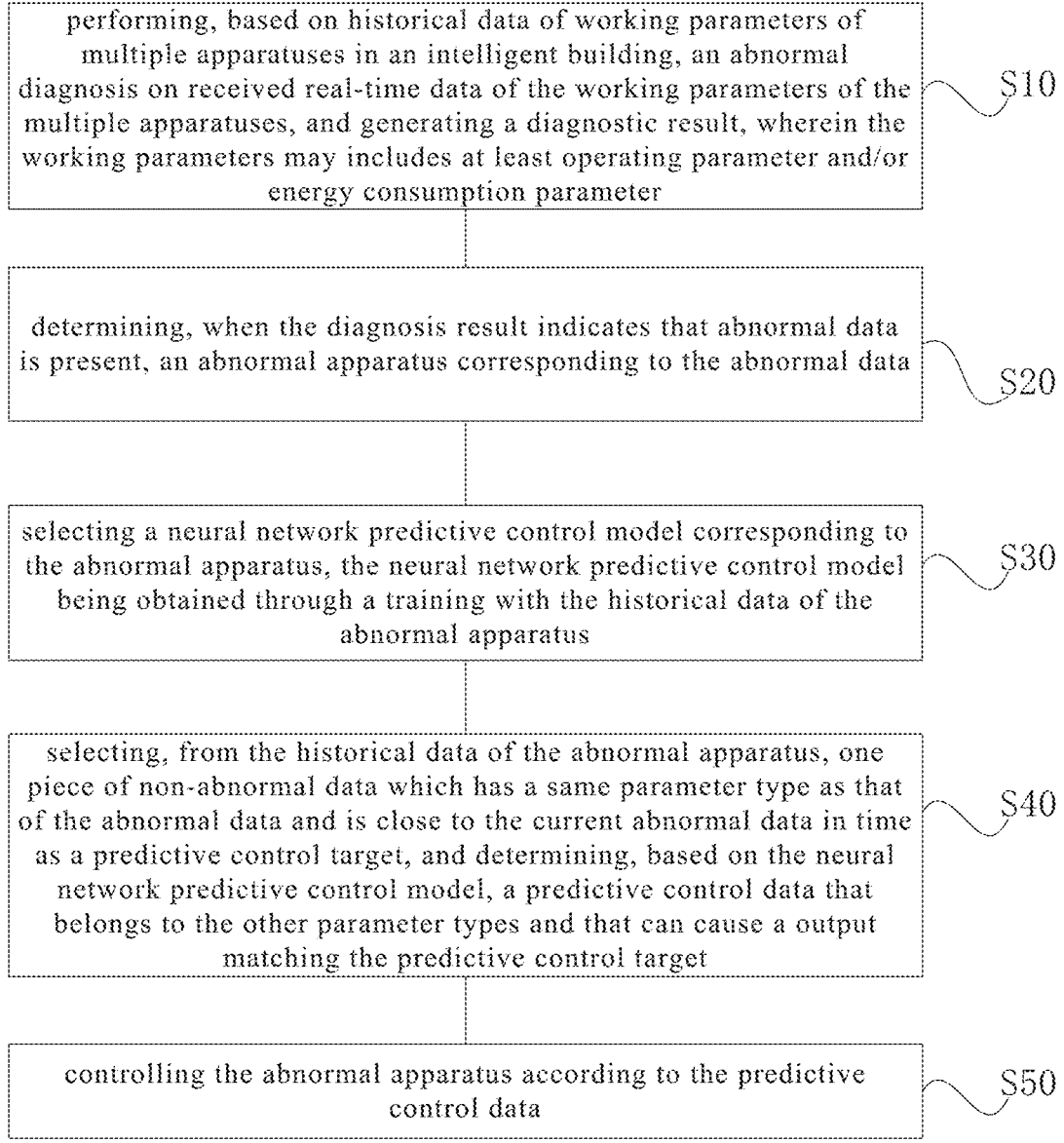

As shown in FIG. 1b, a method for automatically diagnosing and controlling an apparatus in an intelligent building according to some embodiments of the disclosure includes steps as below.

S10: performing, based on historical data of working parameters of multiple apparatuses in an intelligent building, an abnormal diagnosis on received real-time data of the working parameters of the multiple apparatuses, and generating a diagnostic result, wherein the working parameters may include at least operating parameter and/or energy consumption parameter. Taking a refrigeration station as an example, the working parameters include: the chilled water supply temperature, the difference between supply temperature and return temperature of the chilled water, the cooling water supply temperature, the difference between supply temperature and return temperature of the cooling water, the refrigeration station operation efficiency, among which the refrigeration station operation efficiency is an energy consumption parameter, and others are operating parameters.

The working parameters data is actively uploaded by the apparatuses to a control center or the control center can actively access the apparatuses to obtain the data. The embodiments of the disclosure do not limit the manner of obtaining the data. The multiple apparatuses in intelligent building may include a fresh air unit apparatus, an air conditioning apparatus, an elevator unit, a lighting apparatus, a cold source system, a chiller, a chilled pump, a cooling pump, a cooling tower and the like, but not limited to the above listed apparatuses. For the cold source system, the following parameters are included: the cold source system energy consumption, the outdoor temperature, the outdoor humidity, the date type (working day/holiday), the difference between supply temperature and return temperature of the chilled water, the difference between supply temperature and return temperature of the cooling water, the difference between supply pressure and return pressure of the chilled water, the number of chillers powered on, the number of cooling towers powered on, the chilled water flow volume, the chilled water flow rate and the like.

S20: determining, when the diagnosis result indicates that abnormal data is present, an abnormal apparatus corresponding to the abnormal data.

In some embodiments, the step of determining an abnormal device corresponding to the abnormal data includes: analyzing the abnormal data to obtain an apparatus code and further to determine an abnormal apparatus.

The apparatus code includes an identification code for identifying each functional item in the building, an apparatus classification code and an apparatus serial number, wherein the apparatus classification code includes a multi-level classification codes of an apparatus, and the multi-level classification codes include a reserved extension bit for refining classification in the future.

In some embodiments, the apparatus classification code includes first-level to fourth-level sub-classification codes; the first-level code is used to represent a first classification of system to which an apparatus belongs; the second-level code is used to represent a second classification of the system; the third-level code is used to represent a third classification of the system; the fourth-level code is used to represent a fourth classification of the system.

In particular, the second classification is a sub-classification of the first classification, the third classification is a sub-classification of the second classification, the fourth classification of system is a sub-classification of the third classification, and the reserved extension bit is a sub-classification of the fourth classification.

In order to facilitate more efficient operation and management of the apparatuses, an apparatus coding system and a parameter coding system are designed. The apparatus coding system is shown in Table 1 below:

In the Table 1, the classification code of apparatus is composed of 10 characters, wherein every 2 close characters represents one level, and thus five levels are divided, as shown in the following Table 2:

| Level | Coding manner | Meaning |
| --- | --- | --- |
| Level 1 | 2 characters $X_1 X_2$ | Big classification of system (first classification) reflecting general application of assets, such as main attributes and types of assets. |
| Level 2 | 2 characters $X_3 X_4$ | Middle classification of system (second classification) reflecting main function of apparatus assets, which is subdivided from the big classification |
| Level 3 | 2 characters $X_5 X_6$ | Small classification of system (third classification) reflecting specific apparatus, which is further subdivided from the middle classification. |
| Level 4 | 2 characters $X_7 X_8$ | Fine classification of system (fourth classification) served as a refinement of the aforementioned small classification, if there are functional differences between similar products, it is necessary to take the brand and product function into account to classify, and if no refinement is required, $X_7 X_8$ is zero-padded. |
| Level 5 | 2 characters $X_9 X_{10}$ | Reserved bit, which can be reserved as an extension for future refinement of the classification; when undefined, a corresponding bit is zero-padded |

|  | Identification code | Classification code | Serial number |
| --- | --- | --- | --- |
| Code | XY | $X_1 X_2 X_3 X_4 X_5 X_6 X_7 X_8 X_9 X_{10}$ | -NNNN( ) |
| Length | 2 characters | 10 characters | 4 basic numerals |
| Remarks | XY is an identification bit used to identification of type of production item or operation & maintenance item. When no definition is made, all the bits are zero-padded | determined according to the classification coding rules | for example, consecutive values starting from 0001, if exceed the maximum serial number 9999, the length will be expanded to 5 numerals |

The specific apparatus classification codes and descriptions from Level 1 to Level 4 are shown in Table 3 below:

| Level 1 | | Level 2 | | Level 3 | | Level 4 | |
|---|---|---|---|---|---|---|---|
| Big classification code | Description | Middle classification code | Description | Small classification code | Description | Fine classification code | Description |
| 01 | Apparatus assets | 01 | Public facility service | 01 | Chiller | 01 | Complete central units |
| 02 | IT assets | 02 | Electrical system | 02 | Cooling Tower | 02 | Centrifugal |
| 11 | Housing construction | 03 | HVAC system | 03 | Cooling & chilled components | 03 | Reciprocating |
| 99 | Others | 04 | Lighting system | 04 | Heat pump | 04 | Rotary |
| | | 05 | Water supply and drainage | 05 | Air valve | 05 | Spiral |
| | | 06 | Conveyor system and material transport | 06 | Air processing unit | 06 | Screw type |

Hereinafter, apparatus codes for a centrifugal chiller and for a screw-type chiller are taken as an example, as shown in Table 4 below:

| Apparatus name | Identification code | Classification code | Apparatus serial number | Apparatus code |
|---|---|---|---|---|
| Centrifugal chiller | A0 | 01 03 01 02 00 | 0001 | A00103010200-0001 |
| Screw-type chiller | A0 | 01 03 01 06 00 | 10001 | A00103010600-10001 |

The parameter coding system includes three parts, i.e. prefix part, middle part, and suffix part, wherein the prefix part is "acronym of the name", and the suffix part is "system parameter attribute", and every two close parts are separated from each other by "#".

The prefix part example is shown in Table 5 below:

| system name | Acronym |
|---|---|
| heating ventilation air conditioning system | HVC |
| water supply and drainage System | WSD |
| Lightscape Monitoring & Administration System | LAS |
| Public lighting systems | PLS |
| Power Transforming and Distributing System | PTD |

Suffix part is mainly used to indicate the working status of an apparatus, such as operating conditions, fault alarm, manual/automatic status and the like. Suffix consists of lowercase English or English abbreviations. Suffix may be represented by combination of a plurality of English letters, separated from each other by "_". For example, the temperature is represented by t, the supply air temperature is represented by "t_sa", and the return air temperature is represented by "t_ra".

Middle part mainly indicates the type, location and number of an apparatus, which are separated from another by an underline. All the letters in the middle part are in uppercase.

For example, in the parameter code "HVC#AHU_1F_1#t_ra_sp", the prefix "HVC" indicates a heating ventilation air conditioning system, "AHU_1F_1" in the middle indicates "1 floor No. 1 air conditioning unit". The "_sp" in the suffix is an end flag. When a system generates a parameter panel, parameters with the _sp flag are automatically placed in the control bar to distinguish between monitoring parameters and controlling parameters.

In some embodiments, when the diagnostic result indicates that abnormal data exists, the abnormal data is analyzed to obtain a parameter code. For example, the abnormal data is analyzed to obtain the parameter code "HVC#AHU_1F_1#t_ra_sp". Then the prefix and/or suffix in the parameter code can be further determined, for example, the prefix "HVC" and the suffix "t_ra_sp". The apparatus code corresponding to the prefix and/or suffix is searched through the apparatus ledger list including the apparatus coding system and the parameter coding system to determine the abnormal apparatus. For example, the apparatus code "M00103090100-0001" corresponding to the suffix "t_ra_sp" is searched through the apparatus ledger list, so that the abnormal apparatus is determined.

S30: selecting a neural network predictive control model corresponding to the abnormal apparatus, the neural network predictive control model being obtained through a training with the historical data of the abnormal apparatus, wherein the training is carried out by taking historical data of the parameter type(s) of the abnormal data as an output and taking historical data of other parameter type(s) as an input.

In some embodiments, each apparatus corresponds to at least one neural network predictive control model. When the determined abnormal apparatus only corresponds to one neural network predictive control model, this corresponding neural network predictive control model may be directly acquired according to the apparatus code of the abnormal apparatus. When the determined abnormal apparatus corresponds to multiple neural network predictive control models, a corresponding neural network predictive control model is further determined according to the parameter name (suffix) of the abnormal data determined in step S20. In the embodiment of the present invention, a network model library in which are stored the neural network predictive control models for a plurality of apparatuses is established in advance. For an apparatus arranged with only one neural network predictive control model, a unique neural network predictive control model corresponding to the apparatus is stored in the network model library. For an apparatus arranged with multiple neural network predictive control models, different neural network predictive control models corresponding to different parameter names of the apparatus are stored in the network model library.

S40: selecting, from the historical data of the abnormal apparatus, one piece of non-abnormal data which has a same parameter type as that of the abnormal data and is close to the current abnormal data in time as a predictive control target, and determining, based on the neural network predictive control model, a predictive control data that belongs to the other parameter types and that can cause an output matching the predictive control target.

By using the non-abnormal data close to the current abnormal data in time as the target control data, the amplitude of adjustment of the parameters of the apparatus will be small, the drastic changes of the control parameters of the apparatus and of the operating state thereof are avoided (if these drastic changes occur, the components of the apparatus may be damaged. For example, if the difference between supply temperature and return temperature of the chilled water changes drastically, this drastic change in temperature will inevitably lead to the loss of the life of the water flow pipeline). Thus, it is possible to more smoothly perform the optimization control of the abnormal apparatus, whereby avoiding the possible damage to the abnormal apparatus caused by the rapid state transition.

In some embodiments, the piece of non-abnormal data is closest to the current abnormal data in time.

Moreover, by optimizing and adjusting the abnormal apparatus from the current abnormal state to the non-abnormal state at the previous moment, the abnormal apparatus can be transitioned to the normal state as soon as possible, thereby resulting into the efficient adjustment and optimization.

For the predictive control data that belongs to the other parameter types, it can be determined through a plurality of attempts based on the neural network predictive control model. In particular, the historical adjustments data can be used as inputs of the neural network predictive control mode. By comparing the outputs with the predictive control target, the appropriate output matching the target as well as the corresponding input (predictive control data) can be determined.

Taking a refrigeration station as an example, first, after determining the pre-established neural network predictive control model corresponding to the cold source system, the non-abnormal energy consumption data of the cold source system is taken as the control target.

Next, other types of parameter data (for example, the difference between supply temperature and return temperature of the chilled water, the difference between supply temperature and return temperature of the cooling water, the difference between supply pressure and return pressure of the chilled water, the number of chillers powered on, the number of cooling towers powered on, the chilled water flow volume, the chilled water flow rate) that enable the output of the neural network predictive control model to match the predictive control target are determined, wherein, the other types of parameter data are taken as the input of the neural network predictive control model, and find an appropriate input which causes an output matching with the control target.

The other types of determined parameter data are used as predictive control data for formulating an optimal control strategy for optimal control of the cold source system.

S50: controlling the abnormal apparatus according to the predictive control data.

For example, according to the other types of parameter data (the difference between supply temperature and return temperature of the chilled water, the difference between supply temperature and return temperature of the cooling water, the difference between supply pressure and return pressure of the chilled water, the number of chillers powered on, the number of cooling towers powered on, the chilled water flow volume, the chilled water flow rate) determined in step S40, the corresponding parameters in the cold source system are adjusted in order to achieve an optimization regulation and control of the cold source system.

In the above embodiment of the disclosure, by diagnosing, based on historical data of an apparatus in an intelligent building, whether data of the apparatus is abnormal and further by determining a corresponding abnormal apparatus according to the determined abnormal data, so that automatic diagnosis of the abnormal apparatus is realized; then a pre-trained neural network predictive control model is further selected and a particular non-abnormal data of the abnormal apparatus is taken as the target control data to determine the other types of parameter data of the abnormal apparatus matched therewith, and the determined other types of parameter data are used to control the abnormal apparatus so as to realize optimization control of the abnormal apparatus.

In the embodiment of the present invention, historical data of multiple apparatuses in an intelligent building is collected and stored in real time.

Figure 2:
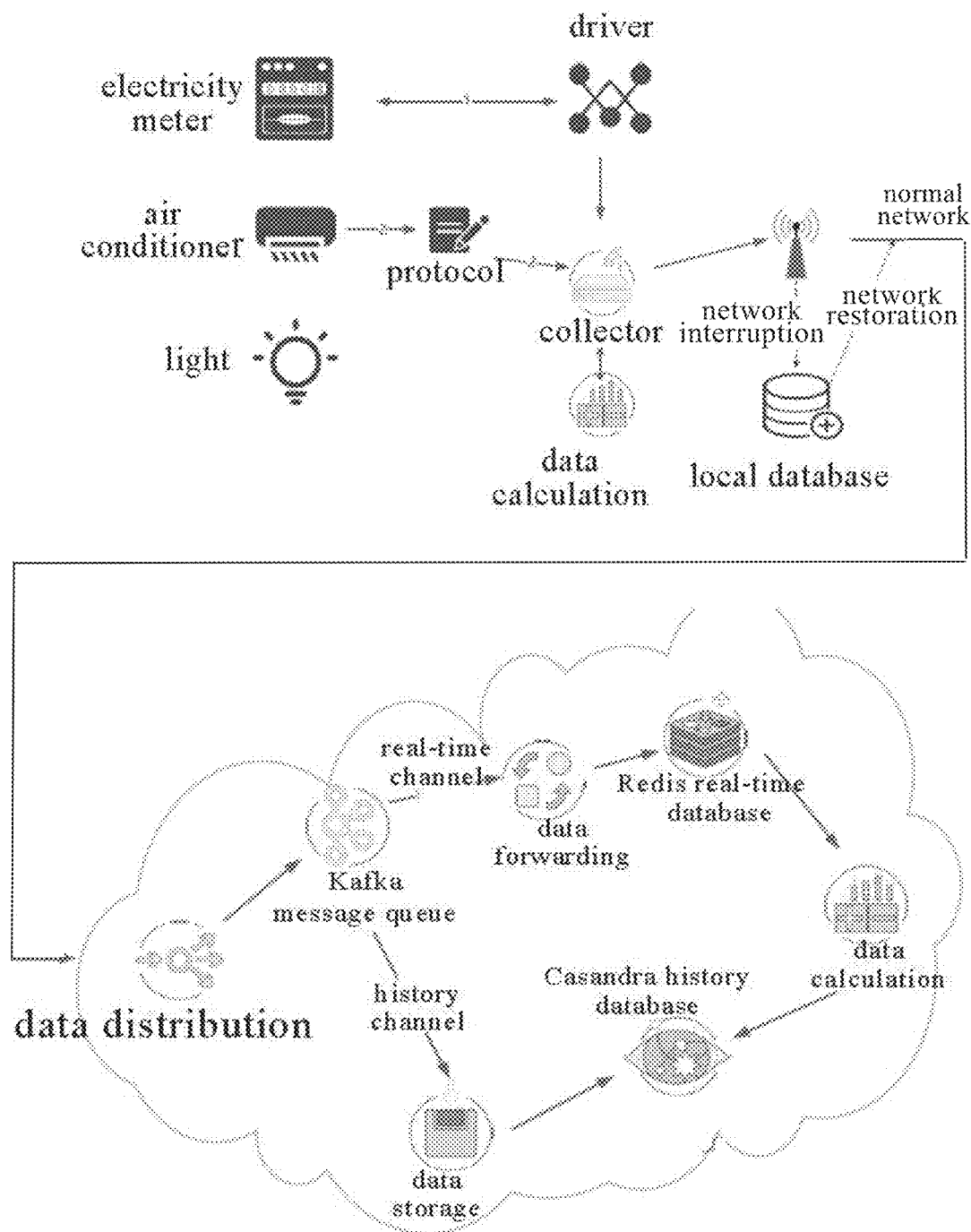
FIG. 2 is an architectural diagram of an embodiment of collecting the apparatus data in a building according to the present invention.

Specifically, as shown in FIG. 2, it is an architectural diagram of an embodiment of collecting the apparatus data in a building according to the present invention. A collector is set locally in an intelligent building, and the collector collects the apparatus data (for example, data for electricity meters, air conditioners, and lights) through a preset protocol or driver. The collected data information is calculated on demand and uploaded to the central or cloud server through the network. In addition, if a network interruption occurs during data collection and upload, the collected data information is stored in a local database, and after the network is restored, the locally stored data information is again uploaded to the cloud server. After receiving the collected data information, the cloud server performs data distribution, and performs data transmission and storage according to the Kafka message queue through a real-time channel and/or a history channel, wherein, when data transmission is performed through the real-time channel, the data is firstly forwarded to a real-time database, and further analyzed and calculated and stored in the history database; When data transmission is performed through the history channel, the data is subjected to the storage processing and then is stored in the history database.

Figure 3:
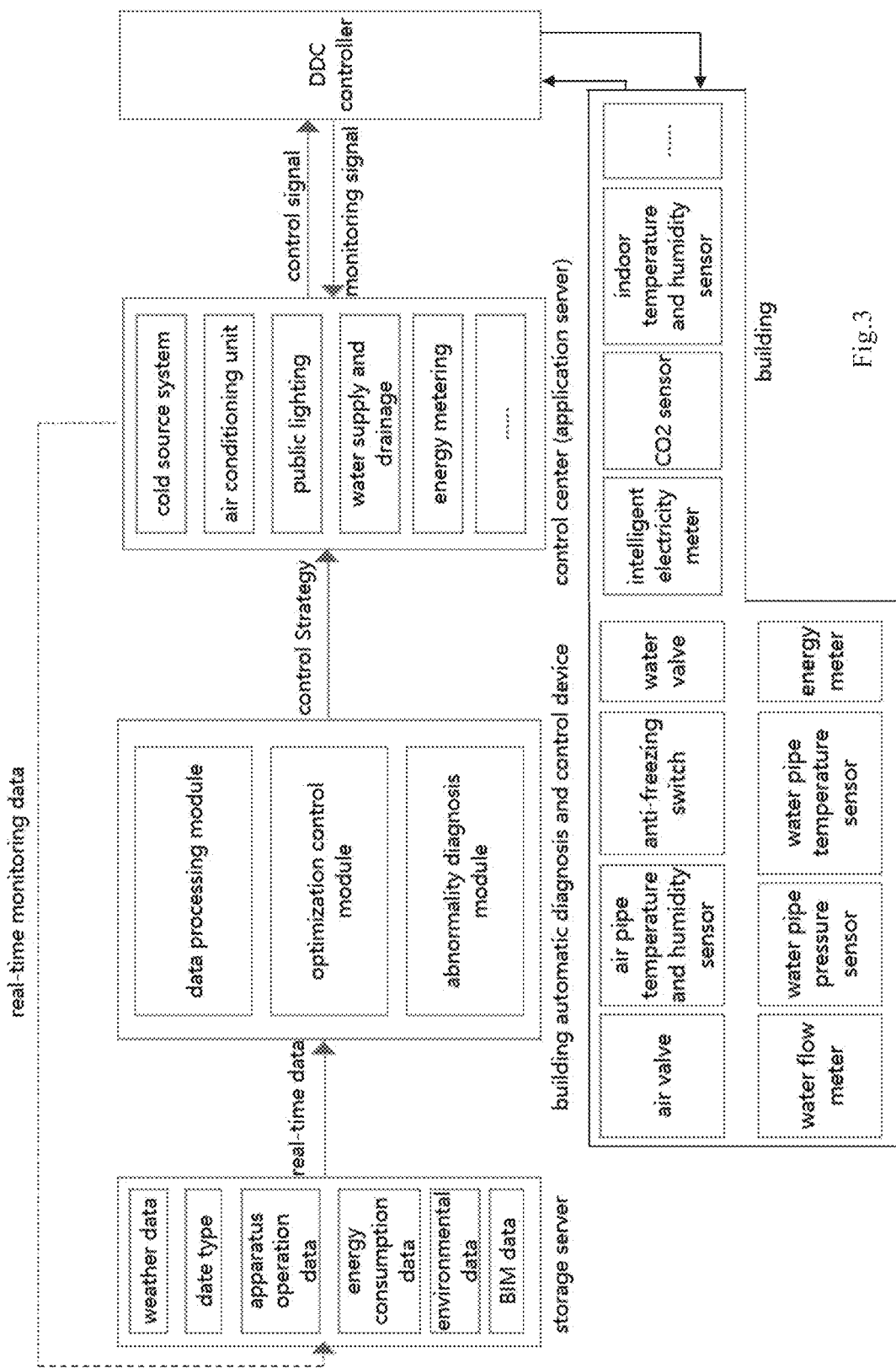
FIG. 3 is an architectural diagram of an embodiment of a system for implementing the method for automatically diagnosing and controlling an apparatus in an intelligent building according to the present invention.

As shown in FIG. 3, it is an architectural diagram of an embodiment of a system for implementing the method for automatically diagnosing and controlling an apparatus in an intelligent building according to the present invention. The building automatic diagnosis and optimization control system performs data processing on apparatus operation data, energy consumption data, weather data, building static data and the like. Through an abnormality diagnosis algorithm, abnormal operation data/energy consumption data are found. The automatic diagnosis and optimization control system for a building formulates optimized control strategies for the normal target values of operation data/energy consumption data and delivers the control strategy to the related apparatus to ensure the optimal effect of the operation data/energy consumption data.

Figure 4:
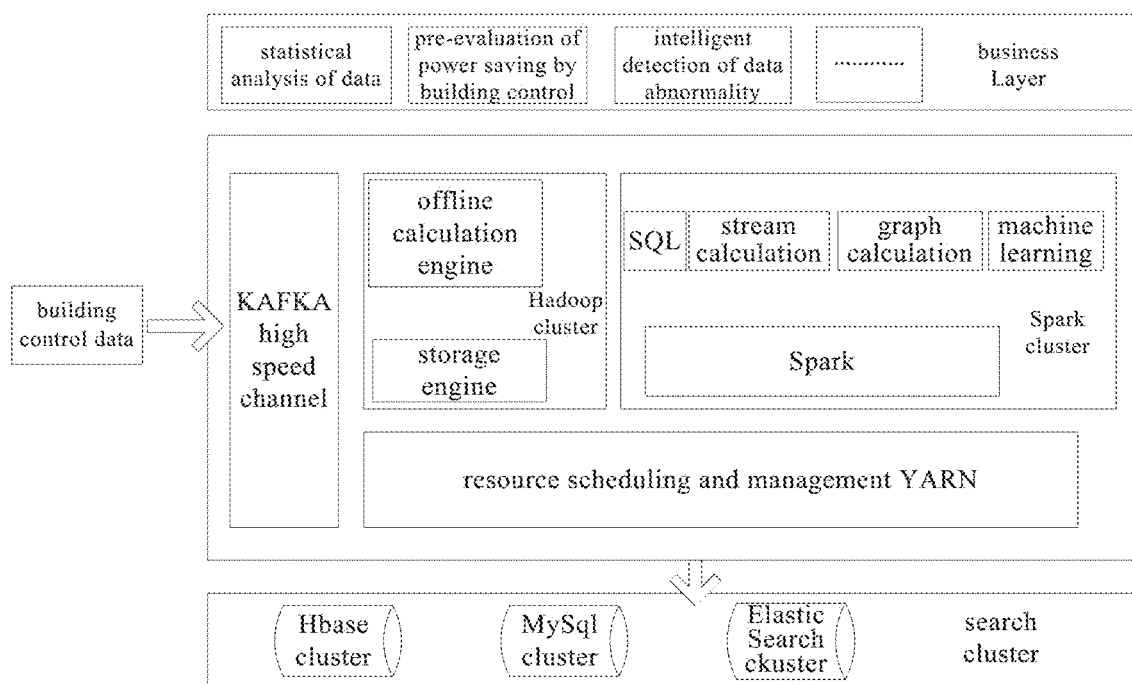
FIG. 4 is an architectural diagram of a building automatic diagnosis and optimization control system for implementing the method for automatically diagnosing and controlling an apparatus in an intelligent building according to the present invention.

As shown in FIG. 4, it is an architectural diagram of a building automatic diagnosis and optimization control system for implementing the method for automatically diagnosing and controlling an apparatus in an intelligent building according to the present invention.

Figure 5:
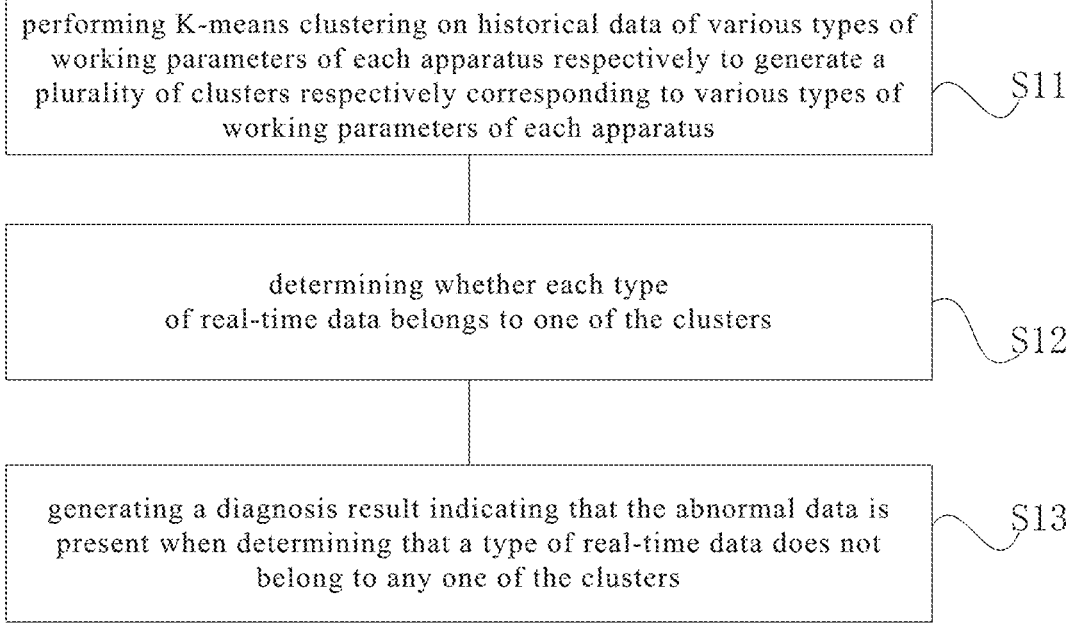
FIG. 5 is a block diagram illustrating an embodiment of step S10.

As shown in FIG. 5, in some embodiments, the step of performing an abnormal diagnosis and generating a diagnostic result includes:

S11: performing K-means clustering on historical data of various types of working parameters of each apparatus respectively to generate a plurality of clusters respectively corresponding to various types of working parameters of each apparatus;

wherein taking a refrigeration station as an example, the working parameter type includes: the chilled water supply temperature, the difference between supply temperature and return temperature of the chilled water, the cooling water supply temperature, the difference between supply temperature and return temperature of the cooling water, the refrigeration station operation efficiency. The historical data of the chilled water supply temperature of the refrigeration station is clustered to obtain clusters corresponding to the chilled water supply temperature; the historical data of the cooling water supply temperature of the refrigeration station is clustered to obtain clusters corresponding to the cooling water supply temperature; the historical data of the cooling water supply and return temperature of the refrigeration station is clustered to obtain clusters corresponding to the difference between supply temperature and return temperature of the cooling water; the historical data of the refrigeration station operation efficiency of the refrigeration station is clustered to obtain clusters corresponding to the refrigeration station operation efficiency.

S12: determining whether each type of real-time data belongs to one of the clusters; and S13: generating a diagnosis result indicating that the abnormal data is present when determining that a type of real-time data does not belong to any one of the clusters.

In this embodiment of the disclosure, an abnormal diagnosis is performed by using a clustering algorithm, such as a k-means algorithm, a hierarchical algorithm, a SOM algorithm, and an FCM algorithm. Specifically, the k-means clustering algorithm is used to cluster the historical data. The k-means algorithm takes k as a parameter and divides n objects into k clusters, so that there is a high degree of similarity in clusters and a low similarity between clusters. The processing of the k-means algorithm is as follows: first, k objects are randomly selected, each object initially representing the average value or center of a cluster; for each remaining object, it is assigned, based on its distance from the center of each cluster, to the nearest cluster; then the average value of each cluster is recalculated. This process is repeated until the criterion function converges. This k-means algorithm improves the accuracy, efficiency and wisdom of the abnormal diagnosis.

In the embodiments of the disclosure, the main objects for anomaly diagnosis can be classified into two types: the apparatus energy consumption data and the apparatus operation data.

The apparatus energy consumption data includes, for example, the power consumption of the cold source system, the power consumption of the chiller, the power consumption of the chilled pump, the power consumption of the cooling pump, the power consumption of the cooling tower and the like.

The apparatus operation data includes, for example, the difference between supply temperature and return temperature of the chilled water, the temperature difference between the cooling water coming into the cooling tower and the cooling water out of the cooling tower, the difference between supply pressure and return pressure of the chilled water, the chilled water flow, the chilled water flow rate, the frequency of the frequency conversion pump, the evaporation temperature of a chiller and the like. (The specific parameter type is determined according to the project situation.)

Figure 6:
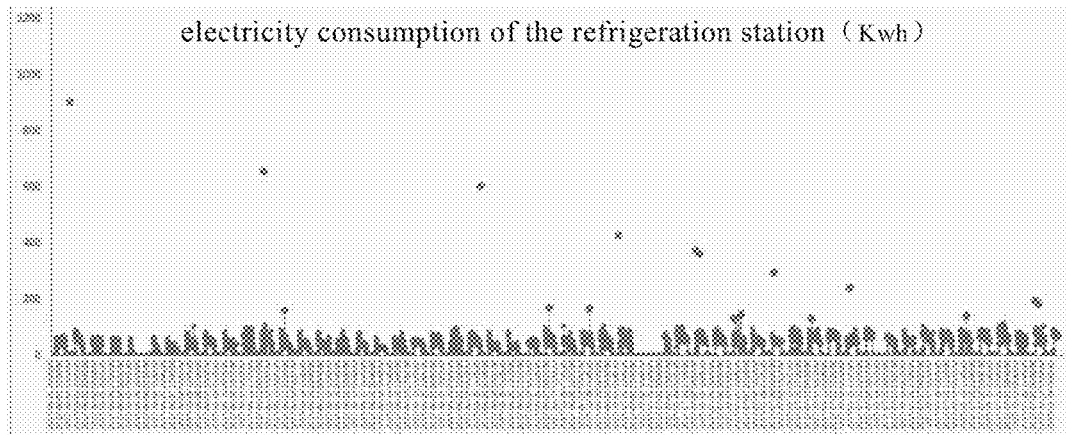
FIG. 6 is a time distribution diagram of power consumption of a cold source system.
Figure 7:
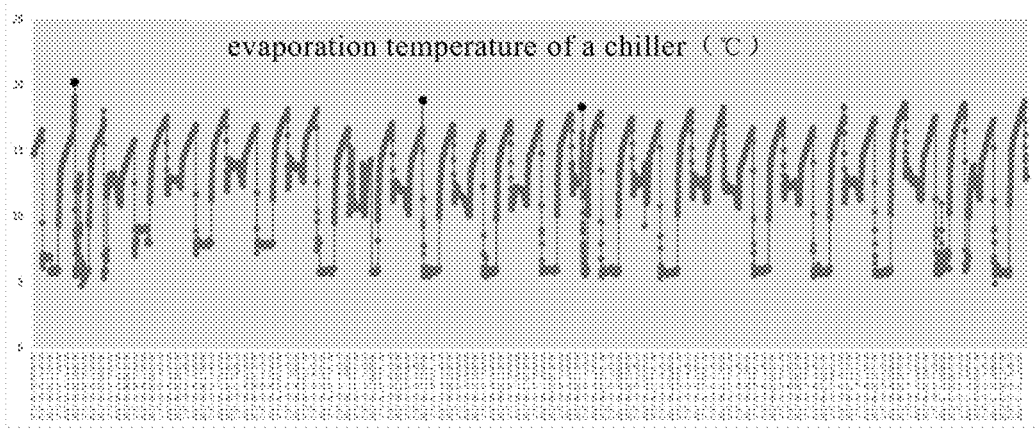
FIG. 7 is a time distribution diagram of evaporation temperature of a chiller.

FIG. 6 is a time distribution diagram of power consumption of a cold source system. FIG. 7 is a time distribution diagram of evaporation temperature of a chiller.

The clustering algorithm is adopted for the power consumption data of a cold source system and the evaporation temperature data of a chiller respectively. The diagnostic result is as follows.

The result of the energy consumption of the cold source system obtained using the k-means clustering algorithm is shown in Table 6 below:

TABLE 6

| No. | Time | Abnormal value |
| --- | --- | --- |
| 1 | 2017 Jun. 1 12:40 | 862.62 |
| 2 | 2017 Jun. 12 20:45 | 669.97 |
| 3 | 2017 Jun. 13 5:45 | 144.16 |
| 4 | 2017 Jun. 25 9:50 | 624.46 |
| 5 | 2017 Jun. 27 11:50 | 135.36 |
| 6 | 2017 Jun. 29 8:55 | 122.19 |
| 7 | 2017 Jul. 1 12:55 | 499.43 |
| 8 | 2017 Jul. 5 11:00 | 417.86 |
| 9 | 2017 Jul. 5 18:05 | 372.71 |
| 10 | 2017 Jul. 7 8:05 | 136.78 |

The result of the evaporation temperature of the chiller obtained using the k-means clustering algorithm is shown in Table 7 below:

TABLE 7

| No. | Time | Abnormal value |
| --- | --- | --- |
| 1 | 2017 Jun. 22 08:55:00 | 20.29 |
| 2 | 2017 Jun. 22 08:45:00 | 20.16 |
| 3 | 2017 Jun. 22 08:50:00 | 20.1 |

Figure 8:
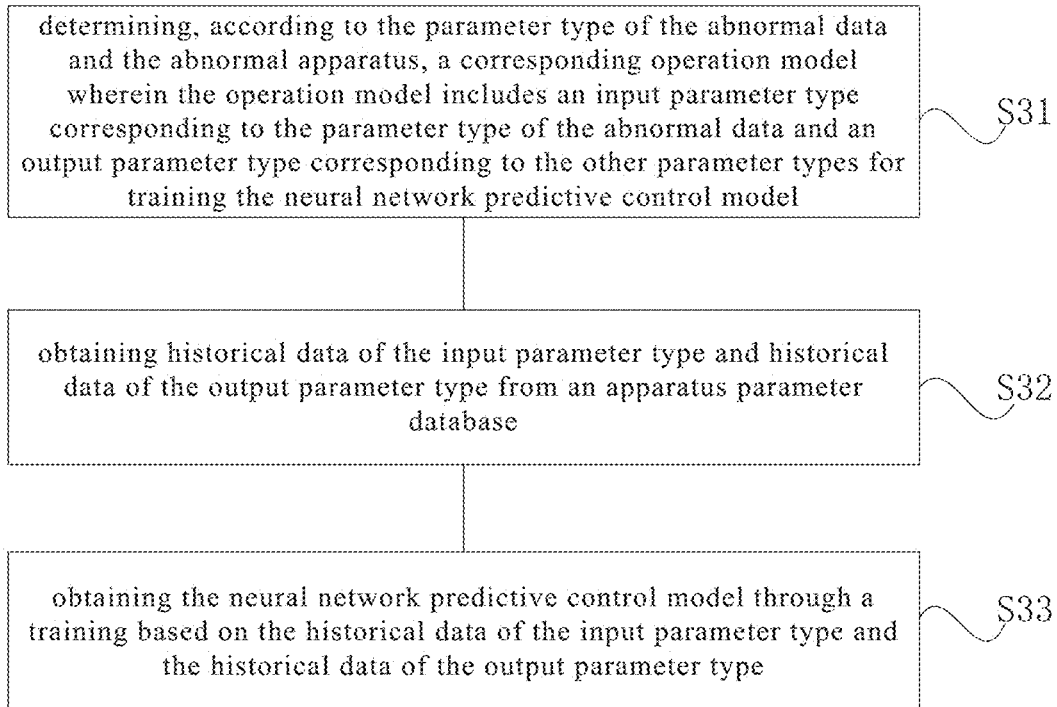
FIG. 8 is a block diagram illustrating an embodiment of step S30.

As shown in FIG. 8, in some embodiments, the neural network predictive control model for the abnormal apparatus is established by the steps of:

S31: determining, according to the parameter type of the abnormal data and the abnormal apparatus, a corresponding operation model wherein the operation model includes an input parameter type corresponding to the parameter type of the abnormal data and an output parameter type corresponding to the other parameter types for training the neural network predictive control model;

S32: obtaining historical data of the input parameter type and historical data of the output parameter type from an apparatus parameter database; and S33: obtaining the neural network predictive control model through a training based on the historical data of the input parameter type and the historical data of the output parameter type.

In the embodiments of the disclosure, the neural network predictive control (NNPC) is used. The neural network has incomparable advantages over other methods in dealing with nonlinear problems, while the predictive control is well targeted for the constrained critical operation. Therefore, the NNPC model provides a good solution to the control of nonlinear, time-varying and strongly-constrained industrial processes. In some embodiments of the disclosure, the NNPC control model can be established based on BP (back propagation) neural network.

The BP neural network is trained as follows, for example.

Step 1: the parameters of the BP neural network is initialized and the historical data of the apparatus is normalized, and after the training, the output is anti-normalized, the historical data after processed of the apparatus is subjected as a population used to the training by means of a genetic algorithm and an in-depth BP neural network prediction model.

Step 2: the population is initialized and the roulette is used to obtain the population, the population size can be determined based on empirical values, the basic principle is to perform sample calculations on the samples and achieve the goal of optimization through hybridization operation.

Step 3: the population fitness value is calculated and the error between the predicted data and the expected data is used as a fitness function.

Step 4: in the hybridization operation, the hybridization rate can be adjusted according to empirical values and determined by experiments.

Step 5: in the mutation operation, the mutation rate can be adjusted based on empirical values and determined by experiments.

Step 6: the operations of selection, hybridization, mutation, and calculation of fitness values are performed repeatedly until the number of evolutions is reached and the optimal initial weights are obtained.

Step 7: the initial weights of the neural network is obtained and the genetic algorithm is used to initialize the weights and thresholds, and when the genetic algorithm is executed for a generation, the new generation of weights is reinserted into the neural network, and the weights can be evolved to an arbitrary size, free from any form of restriction.

Step 8: the output values of the nodes of the hidden layer and of the output layer are calculated.

Step 9: the output error values of the hidden layer and of the output layer are calculated.

Step 10: the error is calculated using the error calculation method to determine whether it falls into the acceptable error range, and if it is an acceptable error, the training ends.

Step 11: the connection weights and thresholds of all layers are constantly adjusted.

Step 12: the neural network training is ended.

In the training process of the neural network predictive control model, the data is organized and the input and output variables of the network are determined. Taking a refrigeration station as an example, the input variables are the historical parameters of the refrigeration station (including the chilled water supply temperature, the difference between supply temperature and return temperature of the chilled water, the cooling water supply temperature and the difference between supply temperature and return temperature of the cooling water), and the output is the operating efficiency of the refrigeration station. The historical parameters of the refrigeration station within a predetermined time are taken as a learning sample, and the neural network BP algorithm is used. FIG. 9 is a schematic structural diagram of a neural network predictive control model in the embodiments of the disclosure. The model includes a neural network predictive controller 60 and a non-linear object 70, wherein the neural network predictive controller 60 includes a neural network predictor 61 and a controller 62, wherein output signals of the controller 62 are used to control a nonlinear object 70, the output of the nonlinear object 70 is fed back to the neural network predictor 61, and the neural network predictor 61 is trained in conjunction with the sample training parameters.

In the embodiments of the disclosure, the operating efficiency of the refrigeration station is taken as an example. When the training and learning is performed adopting the structure of the neural network predictive control model as shown in FIG. 9, the input of the neural network predictor includes at least the chilled water supply temperature, the difference between supply temperature and return temperature of the chilled water, the cooling water supply temperature, and the difference between supply temperature and return temperature of the cooling water, and the output operating efficiency of the refrigeration station is used as a control target to be input into the controller and then the controller obtains the control strategy for achieving the adjustment and control of the non-linear object (i.e., the operating efficiency of the refrigeration station), and after that, the adjusted operating efficiency of the refrigeration station is fed back for feedback regulation.

As shown in FIG. 10, in some embodiments, the step of determining a corresponding operation model according to a parameter type of the abnormal data and the abnormal apparatus includes:

S311: selecting an apparatus operation model group corresponding to the abnormal apparatus from a preset operation model library, wherein apparatus operation model groups of the plurality of apparatuses in the intelligent building are stored in the preset operation model library, and a plurality of operation models of a corresponding apparatus is stored in the apparatus operation model group; and S312: obtaining a corresponding operation model from the selected apparatus operation model group according to a parameter type of the abnormal data.

In some embodiments, the step of determining, based on the neural network predictive control model, a predictive control data that belongs to the other parameter types and that can cause an output matching the predictive control target includes:

using data sets of the other parameter types in a built-in operation model in the apparatus operation model group as inputs of the neural network predictive control model, selecting an output matching the predictive control target from calculated plurality of outputs, and determining a corresponding input based on the selected output and using the same as predictive control data; wherein the apparatus operation model group further includes a custom operation model to allow a user to newly create, edit, and delete the built-in operation model.

In this embodiment, the data sets of other parameter types may be respectively selected from the built-in operation model of the apparatus operation model group and are used as the inputs of the neural network predictive control model to gradually determine the appropriate output which matches the predictive control target, so that the purpose of predictive control is achieved. On the other hand, since a user is allowed to customize the operation model, it is possible to modify the setting parameters of an apparatus in an intelligent building, add new apparatus parameter or remove old apparatus parameter more flexibly according to actual needs. This facilitates the management, operation and maintenance of a building intelligent system and reduces the cost of management, operation and maintenance thereof.

In the embodiments of the disclosure, the operation model data includes training parameters for training the neural network predictive control model and predictive control parameters, wherein the training parameters include input parameters (historical working parameters of an apparatus) for input to the neural network predictive control model, and the predictive control parameters include the parameters in the built-in operation models.

When the control of the energy consumption of the cold source system in the intelligent building is taken as an example, the non-abnormal data of the abnormal apparatus is the non-abnormal energy consumption data of the cold source system, and the resulting optimization control strategy is the adjustment parameter value of the cold source system corresponding to the non-abnormal energy consumption data (the difference between supply temperature and return temperature of the chilled water, the difference between supply temperature and return temperature of the cooling water, the difference between supply pressure and return pressure of the chilled water, the number of chillers powered on, the number of cooling towers powered on, the chilled water flow volume, and the chilled water flow rate); it should be noted that the outdoor temperature, the outdoor humidity, the date type are not included here because these three parameters are objectively present in the environment.

When the control of the cooling capacity of the chiller in the intelligent building is taken as an example, the non-abnormal data of the abnormal apparatus is the non-abnormal cooling capacity of the chiller, and the resulting optimization control strategy is the adjustment parameter value of the chiller corresponding to the non-abnormal cooling capacity data (for example, the difference between supply temperature and return temperature of the chilled water, the difference between supply temperature and return temperature of the cooling water, the chiller operation frequency, the chilled water flow volume, the chilled water flow rate).

In the embodiments of the disclosure, the operation model library can serve as a "professional advisor" for controlling the apparatus, and provides the operation model parameters for optimization control.

The abnormal diagnosis of the refrigeration station operation efficiency and the operation optimization control of the refrigeration station are taken as an example.

The operating efficiency of the refrigeration station is usually used as an indicator to measure the operation situation of the refrigeration station. Through the effective control of relevant parameters of the refrigeration station (for example, the chilled water supply temperature, the difference between supply temperature and return temperature of the chilled water, the cooling water supply temperature, and the difference between supply temperature and return temperature of the cooling water), the operating efficiency of the refrigeration station can be optimized.

The process of abnormal diagnosis and optimization control for "operating efficiency of the refrigeration station" is as follows. The data is transmitted to the anomaly diagnostic module, and the parameter "operating efficiency of the refrigeration station" is anomaly-diagnosed by the clustering algorithm. When the abnormal data of "operating efficiency of the refrigeration station" is diagnosed, the abnormal diagnosis result is output and the diagnosis result is transmitted to the optimization control module. The optimization control module receives the diagnostic result and invokes the operation model of "operating efficiency of the refrigeration station" from the operation model library (model input: the chilled water supply temperature, the chilled water supply and return water temperature, the cooling water supply temperature, and the difference between supply temperature and return temperature of the cooling water; model output: the operating efficiency of the refrigeration station; the control target of operating efficiency of the refrigeration station), and the data required for the operation model is read from the building database.

The optimization control module regards the control target of operating efficiency of the refrigeration station as the control target and adopts the predictive control algorithm to dynamically adjust the chilled water supply temperature, the difference between supply temperature and return temperature of the chilled water, the cooling water supply temperature, and the difference between supply temperature and return temperature of the cooling water, until "the operating efficiency of the refrigeration station" achieves the control target.

As shown in FIG. 11, when there are several sets of data of the other parameter types can cause an output matching the predictive control target, the step of S40 includes:

S41: selecting, from the historical data of the abnormal apparatus, one piece of non-abnormal data which has a same parameter type as that of the abnormal data and is close to the current abnormal data in time as a predictive control target, and determining, based on the neural network predictive control model, several sets of data that belongs to the other parameter types and that can cause a output matching the predictive control target;

S42: obtaining an abnormal parameter set of the other parameter types causing the abnormal data;

S43: determining one set of data from the several sets of data, which is closest in distance to the abnormal parameter set as the predictive control data.

Specifically, each set of data that belongs to the other parameter types constitutes a first multi-dimensional vector, and the abnormal parameter set of the other parameter types constitutes a second multi-dimensional vector. The cosine similarity between each first multi-dimensional vector and the second multi-dimensional vectors is calculated, and the set of data that belongs to the other parameter types corresponding to the smallest cosine similarity value is determined as the predictive control data.

In this embodiment, since the predictive control data is determined based on the smallest cosine similarity value, the amplitude of adjustment and control of the parameter is suitable due to the lower difference between the first multi-dimensional vector and the second multi-dimensional vector, and thus the adjustment of the abnormal apparatus is more smooth and efficient.

In the process of implementing the present method, the inventor found that, due to the large variety of parameters of each apparatus in an intelligent building, when one of the parameters is abnormal, it is not sufficient by only adjusting the parameter directly related to the abnormal parameter, but it is required to make an overall consideration and adjustment of a plurality of parameters directly or indirectly related to the abnormal parameters. Otherwise, a new abnormality of the apparatus may occur due to a partial adjustment. However, the traditional overall adjustment method requires operation and maintenance personnel to constantly adjust many parameters of the apparatus one by one, which is costly and inefficient.

However, the method of the disclosure does not need much manpower. This not only reduces labor costs, but also realizes the automation of apparatus optimization and adjustment as well as the timeliness of apparatus optimization and adjustment, thus ensuring the stable and efficient operation of more and more large intelligent building systems.

It should be noted that, for the foregoing method embodiments, for the sake of brief description, all of the method embodiments are described as a series of operation combinations. However, those skilled in the art should understand that the disclosure is not limited to the sequence of operations described, because certain steps may be performed in other sequences or concurrently according to the disclosure. Secondly, those skilled in the art should also know that some embodiments described in the specification may belong to the preferred embodiments, and the actions and modules involved may be not necessarily required by the disclosure. In the foregoing embodiments, the description of each embodiment has its own emphasis. For the parts that are not described in detail in one embodiment, reference may be made to related descriptions in other embodiments.

In the embodiments of the disclosure, related functions may be implemented by a hardware processor.

An embodiment of the disclosure provides a non-transitory computer-readable storage medium storing executable instructions, when executed by an electronic device, causes the electronic device (including but not limited to a computer, a server, or a network apparatus, etc.) to perform related steps in the foregoing method embodiments, for example:

performing, based on historical data of working parameters of multiple apparatuses in an intelligent building, an abnormal diagnosis on received real-time data of the working parameters of the multiple apparatuses, and generating a diagnostic result;

determining, when the diagnosis result indicates that abnormal data is present, an abnormal apparatus corresponding to the abnormal data;

selecting a neural network predictive control model corresponding to the abnormal apparatus, wherein the neural network predictive control model is obtained through a training with the historical data of the abnormal apparatus, wherein the training is carried out by taking historical data of the parameter type of the abnormal data as an output and taking historical data of other parameter types as an input;

selecting, from the historical data of the abnormal apparatus, one piece of non-abnormal data which has a same parameter type as that of the abnormal data and is close to the current abnormal data in time as a predictive control target, and determining, based on the neural network predictive control model, a predictive control data that belongs to the other parameter types and that can cause an output matching the predictive control target; and controlling the abnormal apparatus according to the predictive control data.

In another aspect, an embodiment of the disclosure further discloses an electronic device, including at least one processor; and a memory communicably connected with the at least one processor and for storing instructions executable by the at least one processor, wherein the execution of the instructions causes the at least one processor to implement the steps of:

performing, based on historical data of working parameters of multiple apparatuses in an intelligent building, an abnormal diagnosis on received real-time data of the working parameters of the multiple apparatuses, and generating a diagnostic result;

determining, when the diagnosis result indicates that abnormal data is present, an abnormal apparatus corresponding to the abnormal data;

selecting a neural network predictive control model corresponding to the abnormal apparatus, wherein the neural network predictive control model is obtained through a training with the historical data of the abnormal apparatus, wherein the training is carried out by taking historical data of the parameter type of the abnormal data as an output and taking historical data of other parameter types as an input;

selecting, from the historical data of the abnormal apparatus, one piece of non-abnormal data which has a same parameter type as that of the abnormal data and is close to the current abnormal data in time as a predictive control target, and determining, based on the neural network predictive control model, a predictive control data that belongs to the other parameter types and that can cause an output matching the predictive control target; and controlling the abnormal apparatus according to the predictive control data.

FIG. 12 is a schematic diagram of a hardware structure of an electronic device for implementing a method for automatic diagnosis and control of an intelligent building according to another embodiment of the present application. As shown in FIG. 12, the device includes: one or more processors 910, and a memory 920, and one processor 910 is used as an example in FIG. 12.

The device for performing the method for automatic diagnosis and control of an intelligent building may further include an input device 930 and an output device 940.

The processor 910, the memory 920, the input device 930, and the output device 940 may be connected by a bus or other means, and the bus connection is taken as an example in FIG. 12.

The memory 920, as a non-transitory computer-readable storage medium, may be used to store non-transitory software programs, non-transitory computer-executable programs, such as the program instructions corresponding to the method for automatic diagnosis and control of intelligent buildings in the embodiments of the present application. The processor 910 executes various functional applications and data processing of the server by running the non-transitory software programs and the instructions stored in the memory 920, so as to implement the method for automatic diagnosis and control of intelligent buildings according to the above method embodiments.

The memory 920 may include a program storage area and a data storage area, wherein the program storage area may store a working system, an application program required by at least one function, and the data storage area may store data created based on the use of the devices for automation diagnostic and control of intelligent buildings, and the like. In addition, the memory 920 may include a high-speed random access memory and may further include non-transitory memory such as at least one magnetic disk storage device, flash memory device, or other non-transitory solid-state storage device. In some embodiments, the memory 920 optionally includes memories remotely disposed relative to the processor 910 and the remote memories may be connected via a network to the devices for automation diagnostic and control of intelligent buildings. Examples of such networks include, but are not limited to, the Internet, intranets, local area networks, mobile communication networks, and combinations thereof.

The input device 930 may receive the inputted numeric or character information and generate the signals related to user settings and functional control for the devices for automation diagnostic and control of intelligent buildings. The output device 940 may include a display device such as a display screen.

The one or more modules are stored in the memory 920 and, when executed by the one or more processors 910, perform the method for automation diagnosis and control of intelligent buildings in any of the above method embodiments.

The above product can execute the method provided in the embodiments of the present application, and has corresponding functional modules and beneficial effects for executing the method. For technical details that are not described in detail in this embodiment, reference may be made to the method provided in the embodiments of the present application.

The electronic devices in the embodiments of the present application is present in various forms, including but not limited to:

(1) mobile communication devices: such devices are characterized by having mobile communication function, and providing voice and data communication as the main target. Such terminals include: smartphones (such as iPhone), multimedia phones, feature phones, and low-end phones and the like.

(2) ultra-mobile personal computer devices: such devices belong to the category of personal computers, have computing and processing functions, and generally also have mobile Internet access features. Such terminals include: PDA, MID and UMPC devices, such as iPads.

(3) portable entertainment devices: such devices can display and play multimedia content, such devices include: audio and video players (such as iPods), handheld game consoles, e-books, and smart toys and portable car navigation devices.

(4) servers: devices providing computing operation, the composition of the server includes processor, hard disk, memory, system bus and so on; servers are similar to general-purpose computer architectures, but require high levels of processing capability, stability, reliability, security, scalability, manageability and the like due to the need to provide highly reliable operation.

(5) other electronic devices with data interaction function.

The device embodiments described above are merely exemplary. The units described as separate components may or may not be physically separated. The components displayed as units may or may not be physical units, that is, may be located in one place or may be distributed to multiple network units. Some or all of the modules may be selected according to actual needs to achieve the objectives of the solutions in this embodiment.

Based on the foregoing description of the embodiments, those skilled in the art may clearly understand that the embodiments may be implemented by software plus a common hardware platform, and certainly may also be implemented by hardware. Based on this understanding, the above technical solutions essentially or the part contributing to the related art can be embodied in the form of a software product. The computer software product may be stored in a computer readable storage medium, such as a ROM/RAM, a magnetic disk, an optical disk or the like, and includes several instructions for causing a computer device (which may be a personal computer, a server, or a network device) to execute the methods described in the respective embodiments or parts of the embodiments.

Finally, it should be noted that the foregoing embodiments are merely intended for describing the technical solutions of the present application, but not for limiting the present application. Although the present application is described in detail with reference to the foregoing embodiments, it should be understood by those skilled in the art that they may still make modifications to the technical solutions described in the foregoing embodiments or make equivalent replacements to some technical features thereof; however, these modifications or replacements do not make the essence of the corresponding technical solutions depart from the spirit and scope of the technical solutions in the embodiments of the present application.

What is claimed is:

1. A method for automatically diagnosing and controlling an apparatus in an intelligent building, the method comprising:

performing, based on historical data of working parameters of multiple apparatuses in an intelligent building, an abnormal diagnosis on received real-time data of the working parameters of the multiple apparatuses, and generating a diagnostic result;

determining, when the diagnosis result indicates that abnormal data indicating that an apparatus does not operate normally is present, an abnormal apparatus corresponding to the abnormal data;

selecting a neural network predictive control model corresponding to the abnormal apparatus according to an abnormal parameter type of the abnormal data and the abnormal apparatus, wherein the neural network predictive control model comprises a neural network predictive controller for a non-linear object, the neural network predictive controller having a neural network predictor and a controller, the non-linear object being various types of working parameters of the abnormal apparatus that have complex relationships with each other, and wherein the neural network predictor obtained through a training with historical data of the non-linear object of the abnormal apparatus within a predetermined time period as a learning sample, wherein the training is carried out by taking data of the parameter type of the abnormal data in the learning sample as an output and taking data of other parameter types in the learning sample as an input;

selecting, from the historical data of the abnormal apparatus, one piece of non-abnormal data which has a same parameter type as that of the abnormal data and is approaching the abnormal data in an order of occurrence time as a predictive control target;

determining, based on the neural network predictor, a first predictive control data that belongs to the other parameter types and correspond to the predictive control target;

adjusting, by the controller, data of the other parameter types of the nonlinear object according to the first predictive control data, to obtain a first adjustment result that belongs to the abnormal parameter type; and feeding back the first adjustment result, by the controller, to the neural network predictor, training the neural network predictor with the learning sample again until a second adjustment result is consistent with the predictive control target, the second adjustment result being obtained after adjusting, by the controller, based on a second predictive control data determined by the trained neural network predictor.

2. The method according to claim 1, wherein the step of performing an abnormal diagnosis and generating a diagnostic result comprises:
   performing K-means clustering on historical data of each of multiple working parameters types of each apparatus, respectively, to generate a plurality of clusters corresponding to each working parameter of each apparatus;
   determining a working parameter type of an apparatus to which the received real-time data belongs, and determining whether the working parameter type belongs to one of a plurality of clusters corresponding to the working parameter type of the apparatus; and
   generating the diagnosis result indicating that the abnormal data is present when determining that the working parameter type of the received real-time data does not belong to any one of the plurality of clusters corresponding to the working parameter type of the apparatus.

3. The method according to claim 1, wherein the neural network predictive control model for the abnormal apparatus is established by the steps of:
   determining, according to the parameter type of the abnormal data and the abnormal apparatus, a corresponding operation model, wherein the operation model is corresponding to a neural network predictive control model and includes an output parameter type corresponding to the parameter type of the abnormal data and input parameter type corresponding to the other parameter types for training the neural network predictor;
   obtaining data of the input parameter types in the leaning sample of the abnormal apparatus and data of the output parameter type in the learning sample of the abnormal apparatus from an apparatus parameter database; and
   obtaining the neural network predictor through a training based on the data of the input parameter types and the data of the output parameter type.

4. The method according to claim 3, wherein the step of determining a corresponding operation model comprises:
   selecting an apparatus operation model group corresponding to the abnormal apparatus from a preset operation model library, wherein apparatus operation model groups of the plurality of apparatuses in the intelligent building are stored in the preset operation model library, and a plurality of operation models of a corresponding apparatus is stored in the apparatus operation model group; and
   obtaining, according to the parameter type of the abnormal data, a corresponding operation model from the selected apparatus operation model group.

5. The method according to claim 1, wherein the step of determining, an abnormal apparatus comprises:
   analyzing, when the diagnosis result indicates that abnormal data is present, the abnormal data to obtain an apparatus code and further to determine an abnormal apparatus;
   wherein the apparatus code includes an identification code for identifying each functional item in the building, an apparatus classification code and an apparatus serial number, wherein the apparatus classification code includes a multi-level classification code of an apparatus, wherein the multi-level classification code includes a reserved extension bit for refining classification.

6. The method according to claim 4, wherein the operation model comprises a built-in operation model and a custom operation model allowing a user to create, edit, and delete an operation model, and wherein the step of determining, a predictive control data comprises:
   using data of the other parameter types in the built-in operation model in the apparatus operation model group as an inputs of the neural network predictor, selecting an output matching the predictive control target from calculated plurality of outputs, and determining a corresponding input based on the selected output and using the same as predictive control data.

7. An electronic device, comprising:
   at least one processor; and
   a memory communicably connected with the at least one processor and for storing instructions executable by the at least one processor, wherein the execution of the instructions causes the at least one processor to:
   perform, based on historical data of working parameters of multiple apparatuses in an intelligent building, an abnormal diagnosis on received real-time data of the working parameters of the multiple apparatuses, and generate a diagnostic result;
   determine, when the diagnosis result indicates that abnormal data indicating that an apparatus does not operate normally is present, an abnormal apparatus corresponding to the abnormal data;
   select a neural network predictive control model corresponding to the abnormal apparatus according to an abnormal parameter type of the abnormal data and the abnormal apparatus, wherein the neural network predictive control model comprises a neural network predictive controller for a non-linear object, the neural network predictive controller having a neural network predictor and a controller, the non-linear object being various types of working parameters of the abnormal apparatus that have complex relationships with each other, and wherein the neural network predictor is obtained through a training with historical data of the non-linear object of the abnormal apparatus within a predetermined time period as a learning sample, and the training is carried out by taking data of the parameter type of the abnormal data in the learning sample as an output and taking data of other parameter types in the learning sample as an input;
   select, from the historical data of the abnormal apparatus, one piece of non-abnormal data which has a same parameter type as that of the abnormal data and is approaching the abnormal data in an order of occurrence time as a predictive control target;
   determine, based on the neural network predictor, a first predictive control data that belongs to the other parameter types and correspond to the predictive control target; and
   adjust, by the controller, data of the other parameter types of the nonlinear object according to the first predictive control data, to obtain a first adjustment result that belong to the abnormal parameter type; and
   feed back the first adjustment result, by the controller, to the neural network predictor, train the neural network predictor with the learning sample again until a second adjustment result is consistent with the predictive control target, the second adjustment result being obtained after adjusting, by the controller, based on a second predictive control data determined by the trained neural network predictor.

8. A non-transitory computer-readable storage medium storing executable instructions, when executed by an electronic device, causes the electronic device to:

perform, based on historical data of working parameters of multiple apparatuses in an intelligent building, an abnormal diagnosis on received real-time data of the working parameters of the multiple apparatuses, and generate a diagnostic result;

determine, when the diagnosis result indicates that abnormal data indicating that an apparatus does not operate normally is present, an abnormal apparatus corresponding to the abnormal data;

select a neural network predictive control model corresponding to the abnormal apparatus according to an abnormal parameter type of the abnormal data and the abnormal apparatus, wherein the neural network predictive control model comprises a neural network predictive controller for a non-linear object, the neural network predictive controller having a neural network predictor and a controller, the non-linear object being various types of working parameters of the abnormal apparatus that have complex relationships with each other, and wherein the neural network predictor is obtained through a training with historical data of the non-linear object of the abnormal apparatus within a predetermined time period as a learning sample, and the training is carried out by taking data of the parameter type of the abnormal data in the learning sample as an output and taking historical data of other parameter types in the learning sample as an input;

select, from the historical data of the abnormal apparatus, one piece of non-abnormal data which has a same parameter type as that of the abnormal data and is approaching the abnormal data in an order of occurrence time as a predictive control target;

determine, based on the neural network predictor, a first predictive control data that belongs to the other parameter types and correspond to the predictive control target;

adjust, by the controller, data of the other parameter types of the nonlinear object according to the first predictive control data, to obtain a first adjustment result that belongs to the abnormal parameter type; and feed back the first adjustment result, by the controller, to the neural network predictor, train the neural network predictor with the learning sample again until a second adjustment result is consistent with the predictive control target, the second adjustment result being obtained after adjusting, by the controller, based on a second predictive control data determined by the trained neural network predictor.

* * * * *